(12) United States Patent
Satpathy et al.

(10) Patent No.: US 9,825,647 B1
(45) Date of Patent: Nov. 21, 2017

(54) METHOD AND APPARATUS FOR DECOMPRESSION ACCELERATION IN MULTI-CYCLE DECODER BASED PLATFORMS

(71) Applicant: Intel Corporation, Santa Clara, CA (US)

(72) Inventors: Sudhir K. Satpathy, Hillsboro, OR (US); James D. Guilford, Northborough, MA (US); Vikram B. Suresh, Hillsboro, OR (US); Sanu K. Mathew, Hillsboro, OR (US); Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/278,329

(22) Filed: Sep. 28, 2016

(51) Int. Cl.
| | | |
|---|---|---|
| *H03M 7/34* | (2006.01) | |
| *H03M 7/30* | (2006.01) | |
| *G06F 9/30* | (2006.01) | |
| *H03M 7/42* | (2006.01) | |

(52) U.S. Cl.
CPC ........ *H03M 7/3053* (2013.01); *G06F 9/3016* (2013.01); *H03M 7/3082* (2013.01); *H03M 7/42* (2013.01)

(58) Field of Classification Search
CPC ............. H03M 13/2767; H03M 13/27; H03M 13/2764; H03M 13/2771; H03M 13/2785; H03M 13/05; H03M 13/2732; H03M 13/2789; H03M 13/299; H03M 13/35; H03M 13/6505; G06F 12/084; G06F 2212/452; G06F 12/0875; G06F 2212/1016; G06F 2212/62; G06F 12/0811; G06F 9/30047; G06F 11/1407; G06F 9/3842

USPC ........ 341/50, 51, 65, 67, 106, 107; 711/100, 711/118, 133, 137, 204, 213, 126, 154
See application file for complete search history.

(56) References Cited

U.S. PATENT DOCUMENTS

| | | | | |
|---|---|---|---|---|
| 5,655,097 | A * | 8/1997 | Witt ..................... | G06F 9/30014 711/147 |
| 5,778,219 | A * | 7/1998 | Amerson ............ | G06F 9/30072 712/244 |
| 7,469,334 | B1 * | 12/2008 | Chaudhry ............. | G06F 9/3863 712/228 |
| 9,513,919 | B2 | 12/2016 | Satpathy et al. | |
| 2002/0194461 | A1 * | 12/2002 | Henry ................... | G06F 9/3806 712/238 |

(Continued)

OTHER PUBLICATIONS

D. Huffman, "A Method for the Construction of Minimum-Redundancy Codes," Proceedings of the I.R.E., vol. 40, Issue 9, Sep. 1952, pp. 1098-1101, 4 pages.

(Continued)

*Primary Examiner* — Linh Nguyen
(74) *Attorney, Agent, or Firm* — Patent Capital Group

(57) ABSTRACT

In one embodiment, an apparatus comprises a decompression engine to perform a non-speculative decode operation on a first portion of a first compressed payload comprising a first plurality of codes; and perform a speculative decode operation on a second portion of the first compressed payload, wherein the non-speculative decode operation and the speculative decode operation share at least one decode path and the non-speculative decode operation is to utilize bandwidth of the at least one decode path that is not used by the non-speculative decode operation.

25 Claims, 14 Drawing Sheets

(56) References Cited

U.S. PATENT DOCUMENTS

2008/0266151 A1* 10/2008 Sankaran ............ H03M 7/4006
341/107

OTHER PUBLICATIONS

P. Deutsch, "RFC 1951—Deflate Compressed Data Format Specification version," Network Working Group, Aladdin Enterprises, May 1996, 15 pages.

* cited by examiner

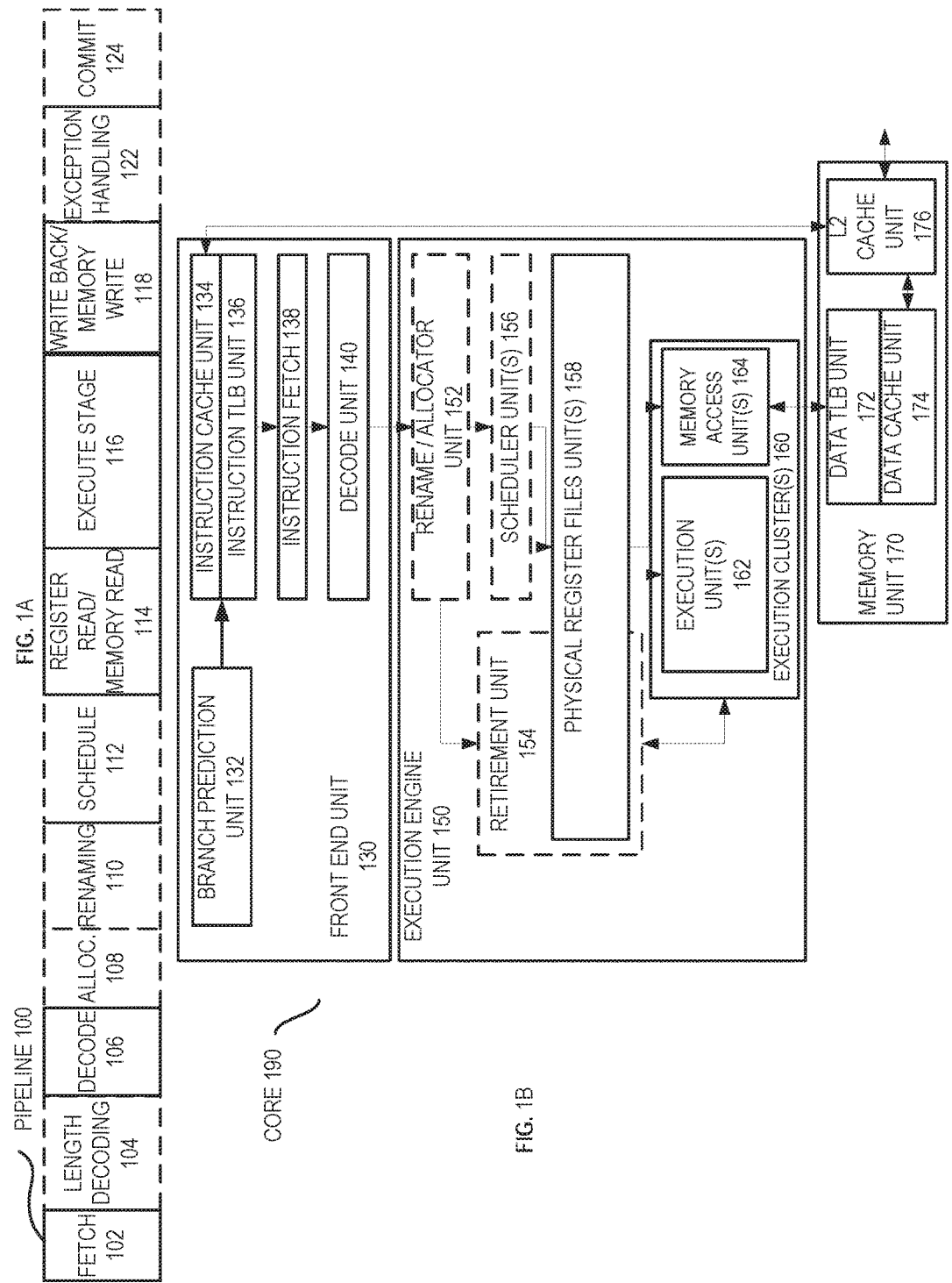

METHOD AND APPARATUS FOR DECOMPRESSION ACCELERATION IN MULTI-CYCLE DECODER BASED PLATFORMS

FIELD

The present disclosure relates in general to the field of computer development, and more specifically, to data decompression.

BACKGROUND

A computing system may include one or more processors, one or more memory devices, and one or more communication controllers, among other components. Logic of the computing device may be operable to access and compress a data set.

BRIEF DESCRIPTION OF THE DRAWINGS

FIG. 1A is a block diagram illustrating both an exemplary in-order pipeline and an exemplary register renaming, out-of-order issue/execution pipeline in accordance with certain embodiments.

FIG. 1B is a block diagram illustrating both an exemplary embodiment of an in-order architecture core and an exemplary register renaming, out-of-order issue/execution architecture core to be included in a processor in accordance with certain embodiments.

Like reference numbers and designations in the various drawings indicate like elements.

DETAILED DESCRIPTION

Figure 2B:
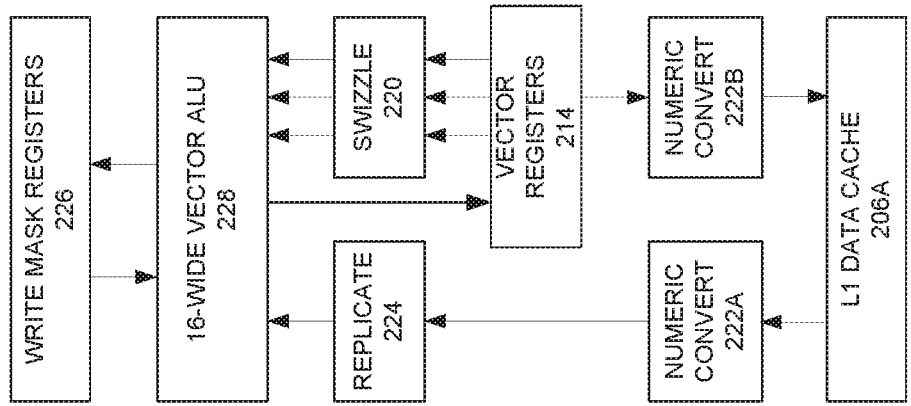
FIGS. 2A-B illustrate a block diagram of a more specific exemplary in-order core architecture, which core would be one of several logic blocks (potentially including other cores of the same type and/or different types) in a chip in accordance with certain embodiments.

Various computer systems and components (e.g., processors, coprocessors, cores, FPGAs, and other components) in which various embodiments (e.g., a decompression engine) of the disclosure may be implemented are described in FIGS. 1-9. Specific examples further describing various embodiments associated with decompression acceleration in multi-cycle decoder based platforms are described in FIGS. 10-15.

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 1A is a block diagram illustrating both an exemplary in-order pipeline and an exemplary register renaming, out-of-order issue/execution pipeline according to embodiments of the disclosure. FIG. 1B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 1A-B illustrate the in-order pipeline and in-order core, while the optional addition of the dashed lined boxes illustrates the register renaming, out-of-order issue/ execution pipeline and core. Given that the in-order aspect is a subset of the out-of-order aspect, the out-of-order aspect will be described.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression and/or decompression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2A:
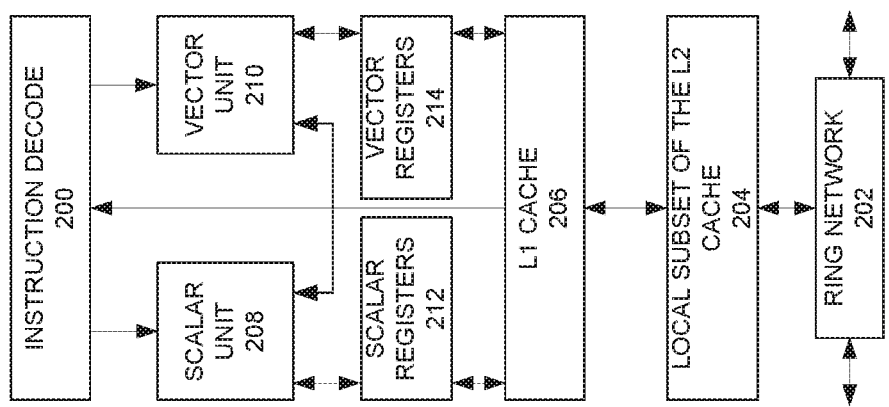

FIGS. 2A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 2A is a block diagram of a single processor core, along with its connection to the on-die interconnect network 202 and with its local subset of the Level 2 (L2) cache 204, according to various embodiments. In one embodiment, an instruction decoder 200 supports the x86 instruction set with a packed data instruction set extension. An L1 cache 206 allows low-latency accesses to cache memory into the scalar and vector units. While in one embodiment (to simplify the design), a scalar unit 208 and a vector unit 210 use separate register sets (respectively, scalar registers 212 and vector registers 214) and data transferred between them is written to memory and then read back in from a level 1 (L1) cache 206, alternative embodiments may use a different approach (e.g., use a single register set or include a communication path that allow data to be transferred between the two register files without being written and read back).

The local subset of the L2 cache 204 is part of a global L2 cache that is divided into separate local subsets (in some embodiments one per processor core). Each processor core has a direct access path to its own local subset of the L2 cache 204. Data read by a processor core is stored in its L2 cache subset 204 and can be accessed quickly, in parallel with other processor cores accessing their own local L2 cache subsets. Data written by a processor core is stored in its own L2 cache subset 204 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 2B is an expanded view of part of the processor core in FIG. 2A according to embodiments. FIG. 2B includes an L1 data cache 206A (part of the L1 cache 206), as well as more detail regarding the vector unit 210 and the vector registers 214. Specifically, the vector unit 210 is a 16-wide vector processing unit (VPU) (see the 16-wide arithmetic logic unit (ALU) 228), which executes one or more of integer, single-precision float, and double-precision float instructions. The VPU supports swizzling the register inputs with swizzle unit 220, numeric conversion with numeric convert units 222A-B, and replication with replication unit 224 on the memory input. Write mask registers 226 allow predicating resulting vector writes.

Figure 3:
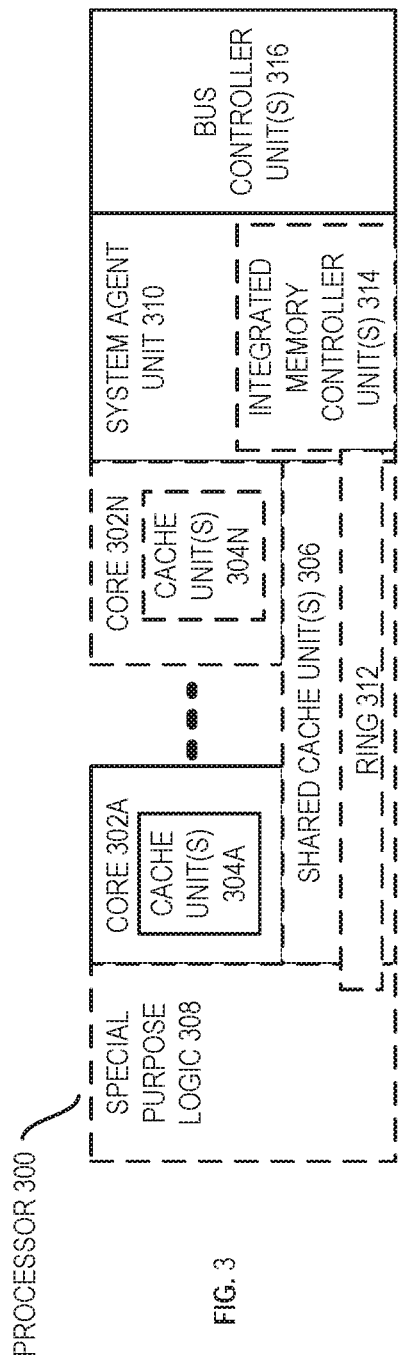
FIG. 3 is a block diagram of a processor that may have more than one core, may have an integrated memory controller, and may have integrated graphics in accordance with certain embodiments.

FIG. 3 is a block diagram of a processor 300 that may have more than one core, may have an integrated memory controller, and may have integrated graphics according to various embodiments. The solid lined boxes in FIG. 3 illustrate a processor 300 with a single core 302A, a system agent 310, and a set of one or more bus controller units 316; while the optional addition of the dashed lined boxes illustrates an alternative processor 300 with multiple cores 302A-N, a set of one or more integrated memory controller unit(s) 314 in the system agent unit 310, and special purpose logic 308.

Thus, different implementations of the processor 300 may include: 1) a CPU with the special purpose logic 308 being integrated graphics and/or scientific (throughput) logic (which may include one or more cores), and the cores 302A-N being one or more general purpose cores (e.g., general purpose in-order cores, general purpose out-of-order cores, or a combination of the two); 2) a coprocessor with the cores 302A-N being a large number of special purpose cores intended primarily for graphics and/or scientific (throughput); and 3) a coprocessor with the cores 302A-N being a large number of general purpose in-order cores. Thus, the processor 300 may be a general-purpose processor, coprocessor or special-purpose processor, such as, for example, a network or communication processor, compression and/or decompression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 300 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 306, and external memory (not shown) coupled to the set of integrated memory controller units 314. The set of shared cache units 306 may include one or more mid-level caches, such as level 2 (L2), level 3 (L3), level 4 (L4), or other levels of cache, a last level cache (LLC), and/or combinations thereof. While in one embodiment a ring based interconnect unit 312 interconnects the special purpose logic (e.g., integrated graphics logic) 308, the set of shared cache units 306, and the system agent unit 310/integrated memory controller unit(s) 314, alternative embodiments may use any number of well-known techniques for interconnecting such units. In one embodiment, coherency is maintained between one or more cache units 306 and cores 302A-N.

In some embodiments, one or more of the cores 302A-N are capable of multi-threading. The system agent 310 includes those components coordinating and operating cores 302A-N. The system agent unit 310 may include for example a power control unit (PCU) and a display unit. The PCU may be or include logic and components needed for regulating the power state of the cores 302A-N and the special purpose logic 308. The display unit is for driving one or more externally connected displays.

The cores 302A-N may be homogenous or heterogeneous in terms of architecture instruction set; that is, two or more of the cores 302A-N may be capable of executing the same instruction set, while others may be capable of executing only a subset of that instruction set or a different instruction set.

FIGS. 4-7 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 4:
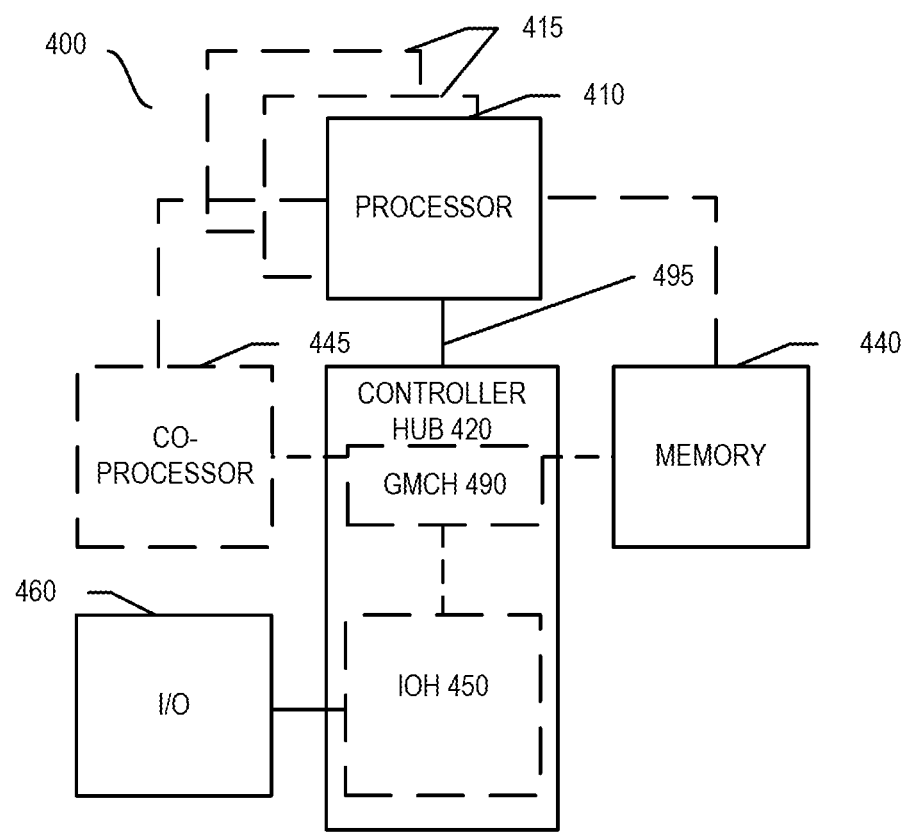
FIGS. 4-7 are block diagrams of exemplary computer architectures in accordance with certain embodiments.

FIG. 4 depicts a block diagram of a system 400 in accordance with one embodiment of the present disclosure. The system 400 may include one or more processors 410, 415, which are coupled to a controller hub 420. In one embodiment the controller hub 420 includes a graphics memory controller hub (GMCH) 490 and an Input/Output Hub (IOH) 450 (which may be on separate chips or the same chip); the GMCH 490 includes memory and graphics controllers coupled to memory 440 and a coprocessor 445; the IOH 450 couples input/output (I/O) devices 460 to the GMCH 490. Alternatively, one or both of the memory and graphics controllers are integrated within the processor (as described herein), the memory 440 and the coprocessor 445 are coupled directly to the processor 410, and the controller hub 420 is a single chip comprising the IOH 450.

The optional nature of additional processors 415 is denoted in FIG. 4 with broken lines. Each processor 410, 415 may include one or more of the processing cores described herein and may be some version of the processor 300.

The memory 440 may be, for example, dynamic random access memory (DRAM), phase change memory (PCM), other suitable memory, or any combination thereof. The memory 440 may store any suitable data, such as data used by processors 410, 415 to provide the functionality of computer system 400. For example, data associated with programs that are executed or files accessed by processors 410, 415 may be stored in memory 440. In various embodiments, memory 440 may store data and/or sequences of instructions that are used or executed by processors 410, 415.

In at least one embodiment, the controller hub 420 communicates with the processor(s) 410, 415 via a multi-drop bus, such as a frontside bus (FSB), point-to-point interface such as QuickPath Interconnect (QPI), or similar connection 495.

In one embodiment, the coprocessor 445 is a special-purpose processor, such as, for example, a high-throughput MIC processor, a network or communication processor, compression and/or decompression engine, graphics processor, GPGPU, embedded processor, or the like. In one embodiment, controller hub 420 may include an integrated graphics accelerator.

There can be a variety of differences between the physical resources 410, 415 in terms of a spectrum of metrics of merit including architectural, microarchitectural, thermal, power consumption characteristics, and the like.

In one embodiment, the processor 410 executes instructions that control data processing operations of a general type. Embedded within the instructions may be coprocessor instructions. The processor 410 recognizes these coprocessor instructions as being of a type that should be executed by the attached coprocessor 445. Accordingly, the processor 410 issues these coprocessor instructions (or control signals representing coprocessor instructions) on a coprocessor bus or other interconnect, to coprocessor 445. Coprocessor(s) 445 accept and execute the received coprocessor instructions.

Figure 5:
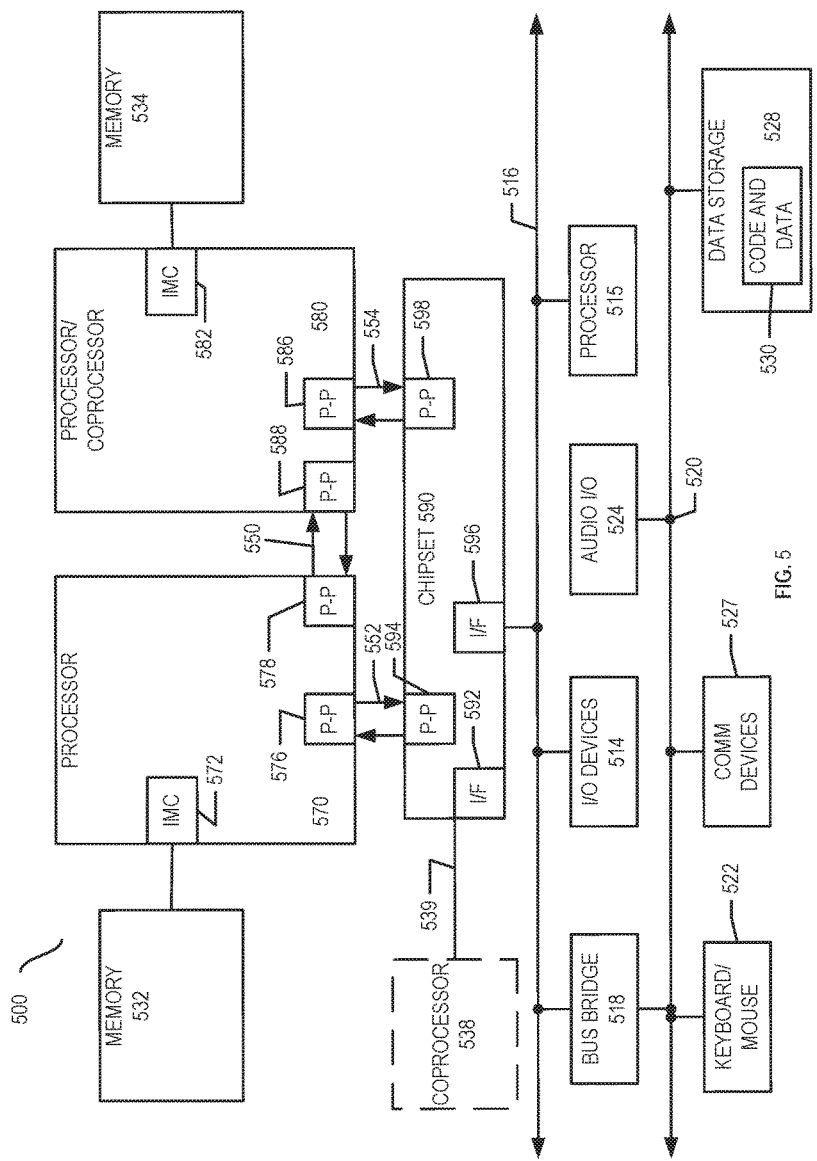

FIG. 5 depicts a block diagram of a first more specific exemplary system 500 in accordance with an embodiment of the present disclosure. As shown in FIG. 5, multiprocessor system 500 is a point-to-point interconnect system, and includes a first processor 570 and a second processor 580 coupled via a point-to-point interconnect 550. Each of processors 570 and 580 may be some version of the processor 300. In one embodiment of the disclosure, processors 570 and 580 are respectively processors 410 and 415, while coprocessor 538 is coprocessor 445. In another embodiment, processors 570 and 580 are respectively processor 410 and coprocessor 445.

Processors 570 and 580 are shown including integrated memory controller (IMC) units 572 and 582, respectively. Processor 570 also includes as part of its bus controller units point-to-point (P-P) interfaces 576 and 578; similarly, second processor 580 includes P-P interfaces 586 and 588. Processors 570, 580 may exchange information via a point-to-point (P-P) interface 550 using P-P interface circuits 578, 588. As shown in FIG. 5, IMCs 572 and 582 couple the processors to respective memories, namely a memory 532 and a memory 534, which may be portions of main memory locally attached to the respective processors.

Processors 570, 580 may each exchange information with a chipset 590 via individual P-P interfaces 552, 554 using point to point interface circuits 576, 594, 586, 598. Chipset 590 may optionally exchange information with the coprocessor 538 via a high-performance interface 539. In one embodiment, the coprocessor 538 is a special-purpose processor, such as, for example, a high-throughput MIC processor, a network or communication processor, compression and/or decompression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present disclosure is not so limited.

As shown in FIG. 5, various I/O devices 514 may be coupled to first bus 516, along with a bus bridge 518 which couples first bus 516 to a second bus 520. In one embodiment, one or more additional processor(s) 515, such as coprocessors, high-throughput MIC processors, GPGPU's, accelerators (such as, e.g., graphics accelerators or digital signal processing (DSP) units), field programmable gate arrays, or any other processor, are coupled to first bus 516. In one embodiment, second bus 520 may be a low pin count (LPC) bus. Various devices may be coupled to a second bus 520 including, for example, a keyboard and/or mouse 522, communication devices 527 and a storage unit 528 such as a disk drive or other mass storage device which may include instructions/code and data 530, in one embodiment. Further, an audio I/O 524 may be coupled to the second bus 520. Note that other architectures are contemplated by this disclosure. For example, instead of the point-to-point architecture of FIG. 5, a system may implement a multi-drop bus or other such architecture.

Figure 6:
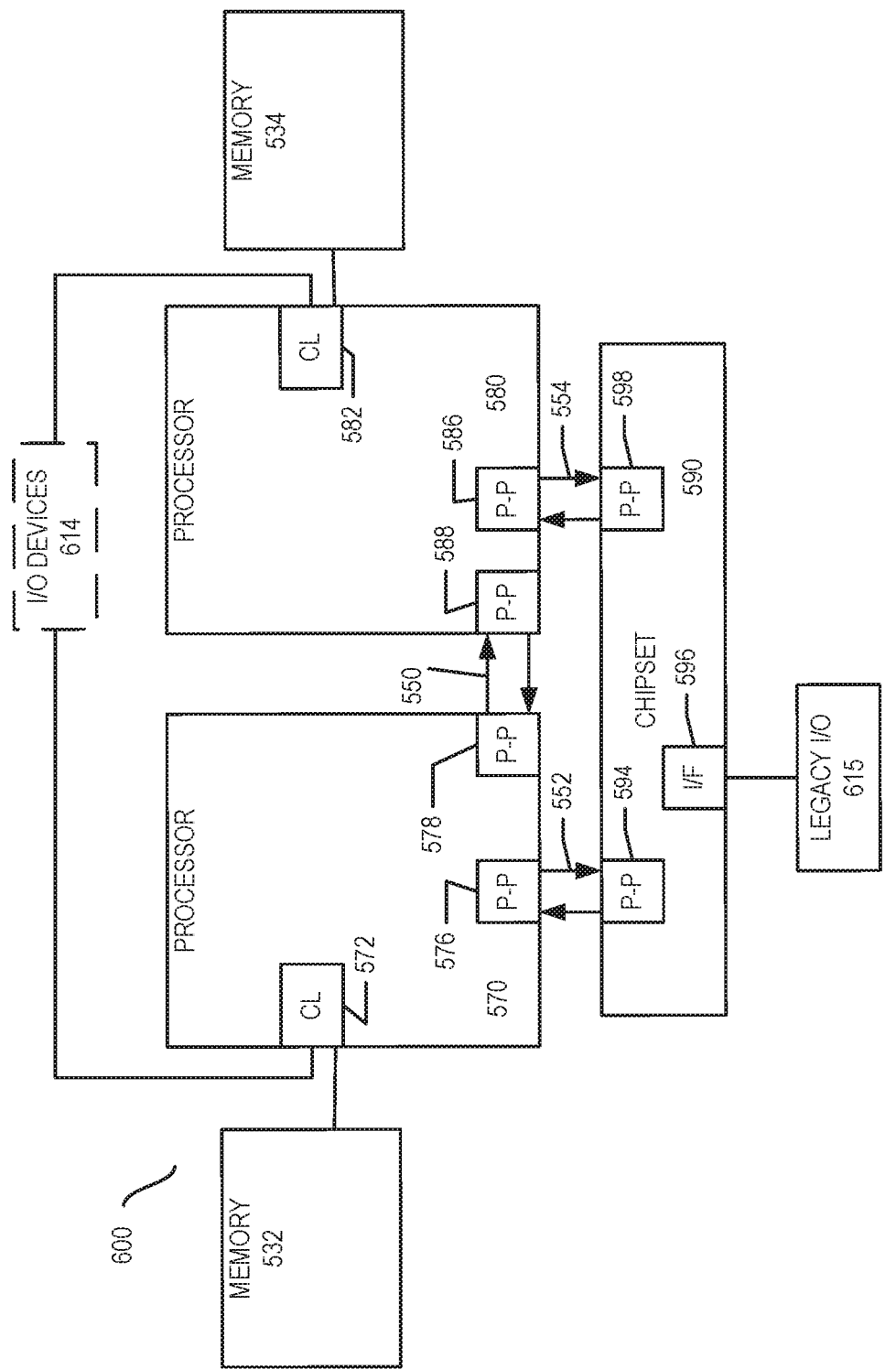

FIG. 6 depicts a block diagram of a second more specific exemplary system 600 in accordance with an embodiment of the present disclosure. Similar elements in FIGS. 5 and 6 bear similar reference numerals, and certain aspects of FIG. 5 have been omitted from FIG. 6 in order to avoid obscuring other aspects of FIG. 6.

FIG. 6 illustrates that the processors 570, 580 may include integrated memory and I/O control logic ("CL") 572 and 582, respectively. Thus, the CL 572, 582 include integrated memory controller units and include I/O control logic. FIG. 6 illustrates that not only are the memories 532, 534 coupled to the CL 572, 582, but also that I/O devices 614 are also coupled to the control logic 572, 582. Legacy I/O devices 615 are coupled to the chipset 590.

Figure 7:
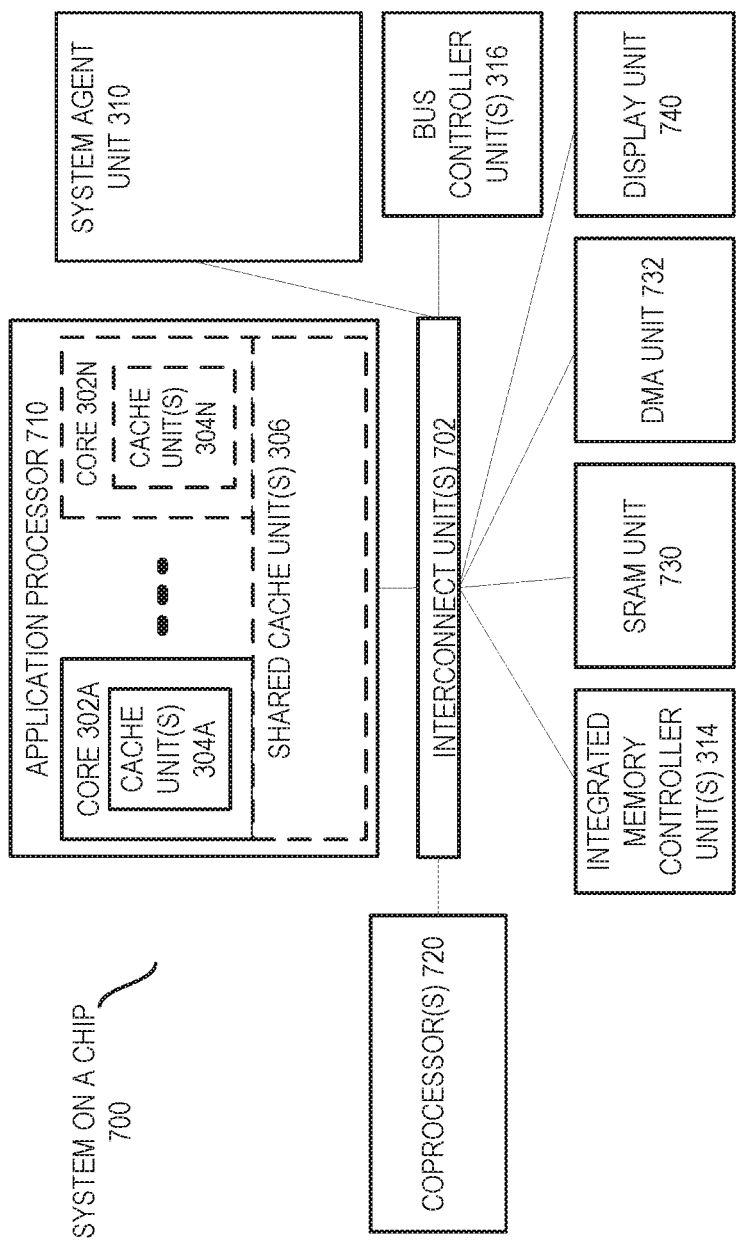

FIG. 7 depicts a block diagram of a SoC 700 in accordance with an embodiment of the present disclosure. Similar elements in FIG. 3 bear similar reference numerals. Also, dashed lined boxes are optional features on more advanced SoCs. In FIG. 7, an interconnect unit(s) 702 is coupled to: an application processor 710 which includes a set of one or more cores 202A-N and shared cache unit(s) 306; a system agent unit 310; a bus controller unit(s) 316; an integrated memory controller unit(s) 314; a set or one or more coprocessors 720 which may include integrated graphics logic, an image processor, an audio processor, and a video processor; an static random access memory (SRAM) unit 730; a direct memory access (DMA) unit 732; and a display unit 740 for coupling to one or more external displays. In one embodiment, the coprocessor(s) 720 include a special-purpose processor, such as, for example, a network or communication processor, compression and/or decompression engine, GPGPU, a high-throughput MIC processor, embedded processor, or the like.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 8:
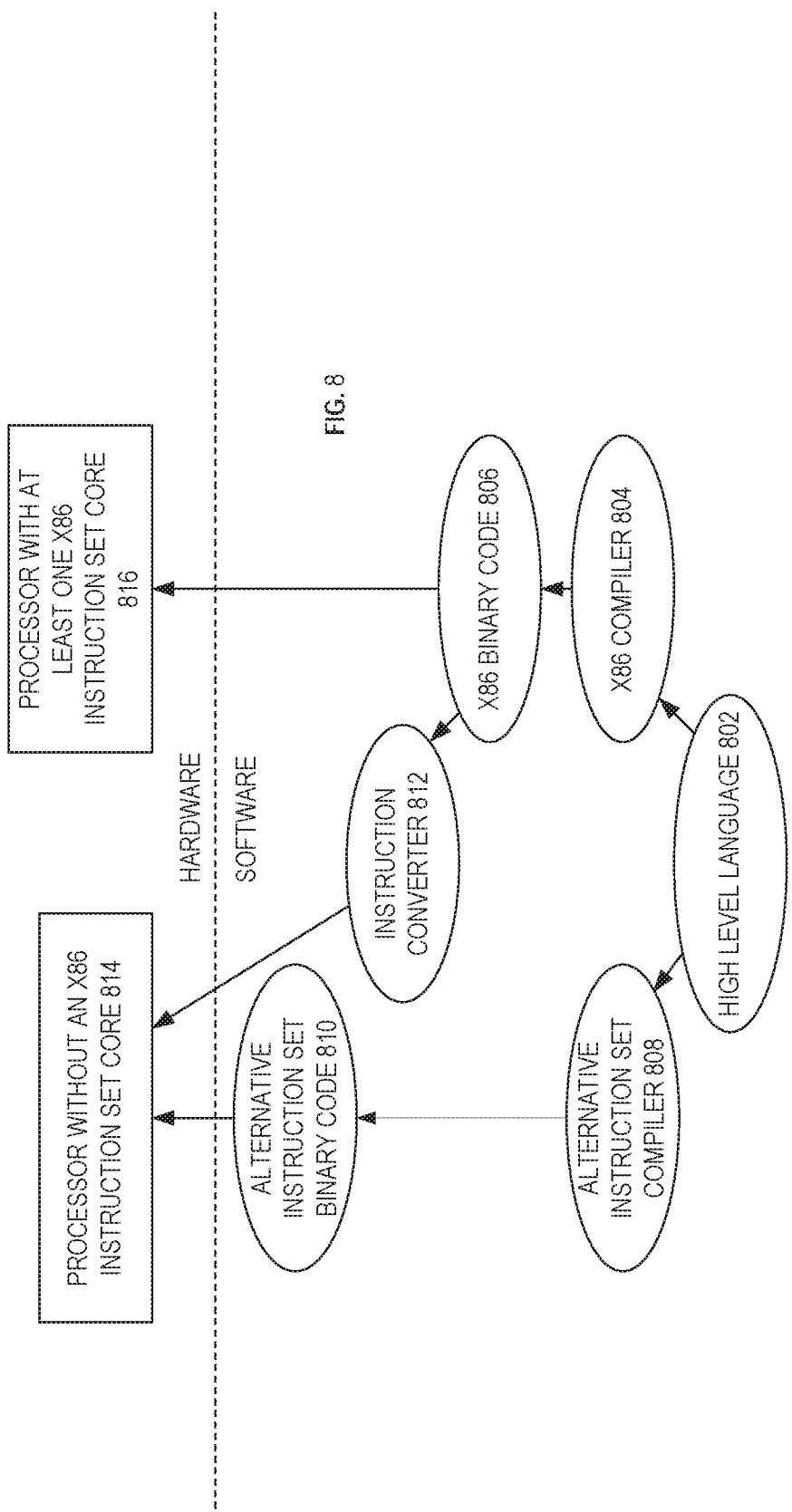
FIG. 8 is a block diagram contrasting the use of a software instruction converter to convert binary instructions in a source instruction set to binary instructions in a target instruction set in accordance with certain embodiments.

FIG. 8 is a block diagram contrasting the use of a software instruction converter to convert binary instructions in a source instruction set to binary instructions in a target instruction set according to embodiments of the disclosure. In the illustrated embodiment, the instruction converter is a software instruction converter, although alternatively the instruction converter may be implemented in software, firmware, hardware, or various combinations thereof. FIG. 8 shows a program in a high level language 802 may be compiled using an x86 compiler 804 to generate x86 binary code 806 that may be natively executed by a processor with at least one x86 instruction set core 816. The processor with at least one x86 instruction set core 816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 804 represents a compiler that is operable to generate x86 binary code 806 (e.g., object code) that can, with or without additional linkage processing, be executed on the processor with at least one x86 instruction set core 816. Similarly, FIG. 8 shows the program in the high level language 802 may be compiled using an alternative instruction set compiler 808 to generate alternative instruction set binary code 810 that may be natively executed by a processor without at least one x86 instruction set core 814 (e.g., a processor with cores that execute the MIPS instruction set of MIPS Technologies of Sunnyvale, Calif. and/or that execute the ARM instruction set of ARM Holdings of Sunnyvale, Calif.). The instruction converter 812 is used to convert the x86 binary code 806 into code that may be natively executed by the processor without an x86 instruction set core 814. This converted code is not likely to be the same as the alternative instruction set binary code 810 because an instruction converter capable of this is difficult to make; however, the converted code will accomplish the general operation and be made up of instructions from the alternative instruction set. Thus, the instruction converter 812 represents software, firmware, hardware, or a combination thereof that, through emulation, simulation or any other process, allows a processor or other electronic device that does not have an x86 instruction set processor or core to execute the x86 binary code 806.

Figure 9:
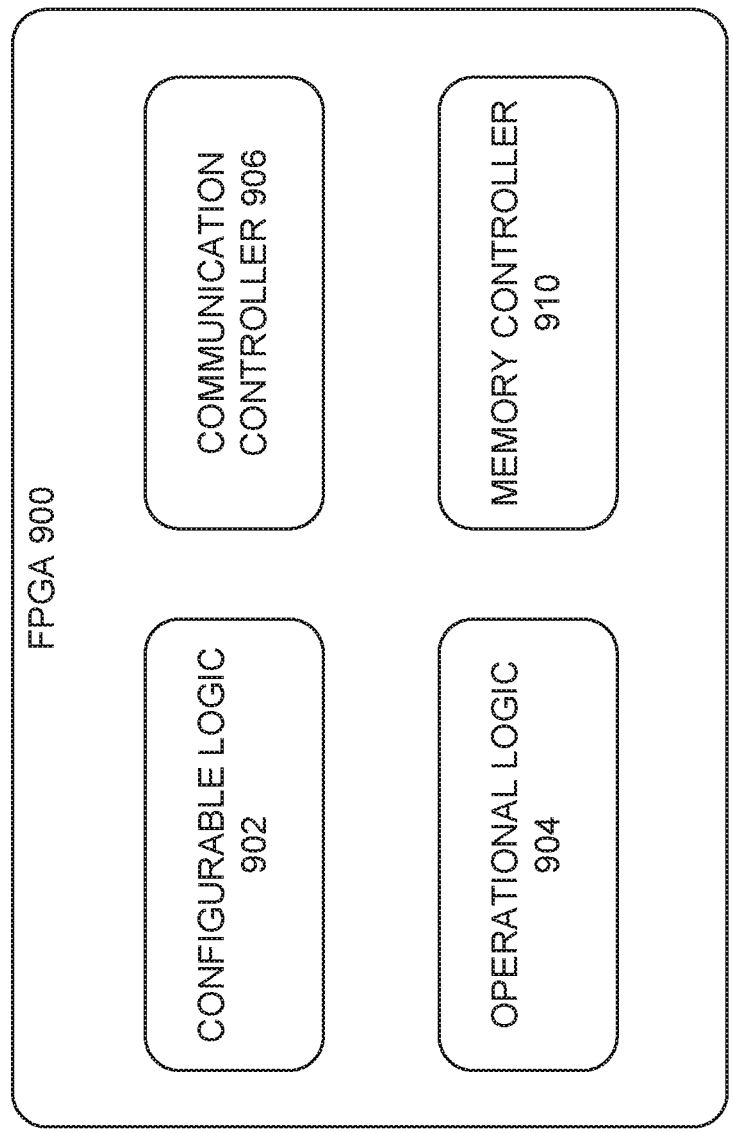
FIG. 9 illustrates an example field-programmable gate array (FPGA) in accordance with certain embodiments.

FIG. 9 illustrates an example block diagram of a field programmable gate array (FGPA) 900 in accordance with certain embodiments. In a particular embodiment, a decompression engine may be implemented by an FPGA 900. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 900 includes configurable logic 902, operational logic 904, communication controller 906, and memory controller 910. Configurable logic 902 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a decompression engine. Some FPGAs 900 may be limited to executing a single kernel at a time while other FPGAs may be capable of executing multiple kernels simultaneously. The configurable logic 902 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 904 may access a data structure defining a kernel and configure the configurable logic 902 based on the data structure and perform other operations of the FPGA. In some embodiments, operational logic 904 may write control bits to memory (e.g., nonvolatile flash memory or SRAM based memory) of the FPGA 900 based on the data structure, wherein the control bits operate to configure the logic (e.g., by activating or deactivating particular interconnects between portions of the configurable logic). The operational logic 904 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 906 may enable FPGA 900 to communicate with other components (e.g., another compression engine 102) of a computer system (e.g., to receive commands to compress data sets). Memory controller 910 may enable the FPGA to read data (e.g., operands or results) from or write data to memory of a computer system. In various embodiments, memory controller 910 may comprise a direct memory access (DMA) controller.

Figure 10:
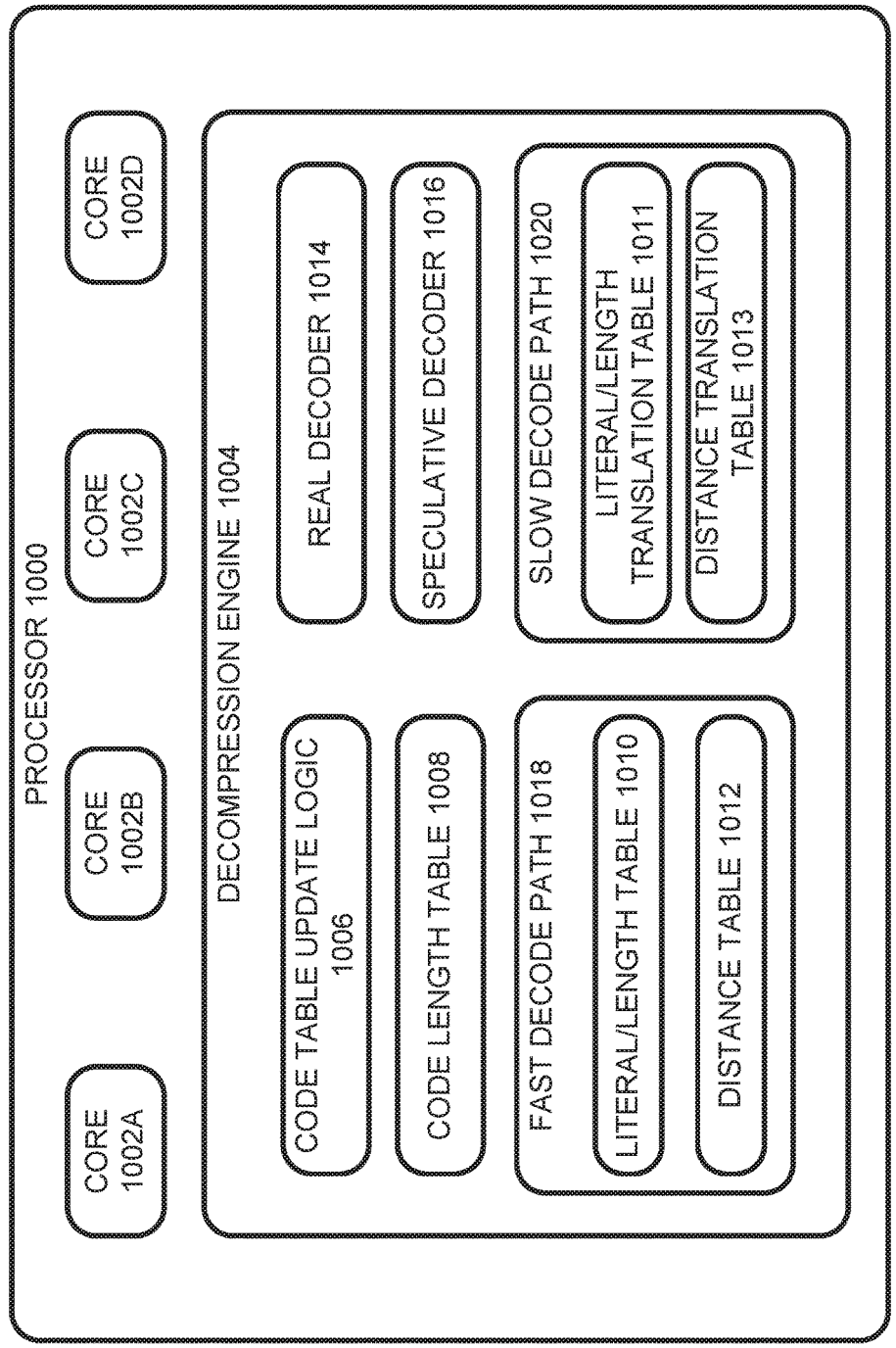
FIG. 10 illustrates a block diagram of an example decompression engine within a processor in accordance with certain embodiments.

FIG. 10 illustrates a block diagram of an example processor 1000 comprising a decompression engine 1004 in accordance with certain embodiments. Processor 1000 also includes a plurality of cores 1002 and any other suitable components. Decompression engine 1004 may provide decompression acceleration in a multi-cycle decoder based platform according to various embodiments described herein. A particular embodiment provides a DEFLATE decompression engine that leverages the converging nature of Huffman codes to enable speculative out-of-order symbol decoding on a multi-cycle decoder based platform. DEFLATE is a widely deployed lossless compression/decompression standard and is used in many software applications/libraries including, but not limited to, GZIP, PKZIP, BZIP2, ZLIB, 7-ZIP, PNG, .ZIP, and other applications. The DEFLATE algorithm is specified in its basic format in Request for Comments (RFC) 1951, available at https://www.ietf.org/rfc/rfc1951.txt. While the embodiments of the disclosure described below focus on a DEFLATE compression operation using Huffman coding, the underlying principles of the disclosure may be implemented on any form of prefix coding and may also be used in other forms of lossless compression algorithms. As various examples, the techniques described herein may be applied to speed up decoding of other forms of Huffman codes such as used in JPEG, MPEG, etc., other lossless compression algorithms, or on any other decompression algorithm in which speculative decompression (i.e., decompression beginning from a random point within a compressed payload) may be used in conjunction with real decompression (i.e., decompression beginning from the start of the compressed payload).

The DEFLATE operation compresses raw data into a stream of literal and length+distance symbols that are subsequently Huffman encoded based on their frequency of occurrence to achieve further compression. Each symbol is represented by a code varying in length from 1 b-15 b. Some of the length and distance codes may also utilize a variable number of additional bits (0-13 b) from the payload that are concatenated with the Huffman decoded base during decompression. The variable length encoding along with the serial nature of DEFLATE algorithm prevents the decoding of any subsequent symbol before processing the symbol that is the earliest in the compressed payload. This fundamental bottleneck of the algorithm limits typical decompression throughput to 1 symbol/decode-cycle at best, irrespective of the number of cores and specialized hardware Huffman decoders available in a system. This throughput drops as the decode-cycle lengthens (e.g., the throughput of a decoder with a decode-cycle equal to one clock cycle may be twice the throughput of a decoder with a decode-cycle equal to two clock cycles).

Various methods for decompression acceleration may rely on storing pre-computed Huffman codes in a lookup table while parsing the payload header. This simplifies the critical Huffman decoding step to a simple memory look-up. However, the exponentially increasing storage requirement to incorporate longer codes may make it prohibitive to store all codes in memory. For example, accelerating the Huffman decoding step in a DEFLATE payload to achieve a throughput of 1 symbol/decode-cycle would utilize 128 KB of memory to exhaustively store Huffman codes for all possible inputs. If large amounts of memory are incorporated into an accelerator, design constraints may result in compiler generated sequential macros being used for the memory. However, such memory may be slow, reducing operating frequency or imposing multi-cycle latency for content access. This problem may be aggravated in FPGA based platforms where sequential resources are scarce and extra pipelining would have to be used to achieve a target operating frequency. Since Huffman decoding is an inherently serial process that requires a symbol to be fully decoded before accurately performing the subsequent decode, such multi-cycle macros insert idle cycles in the decompression pipeline, thus diminishing system throughput.

Various embodiments described herein break the serial dependency of Huffman codes and enable out-of-order DEFLATE decompression using index based check-pointing assisted speculation during clock cycles that are unused during in-order DEFLATE compression. These techniques can be deployed in software and/or hardware in multi-cycle decoder based platforms to achieve DEFLATE decompression rates approaching 1 symbol/clock cycle (which may result in significant performance increase when a decode-cycle is more than one clock cycle). Some embodiments may utilize algorithmic and architectural innovations that allow idle cycles in a decompression pipeline to be utilized for speculatively decoding an advance payload with greater than 99% success probability, thus providing opportunities for dramatic throughput improvements on decoding acceleration platforms.

In a particular embodiment, a speculative decode operation is launched at a random starting point in the DEFLATE payload in addition to a real decode operation (also referred to herein as a non-speculative decode operation) that starts from the beginning of the payload. The speculative operation generates a few incorrect symbols and subsequently converges to a genuine starting index, following which the speculative decode operation generates correctly decoded symbols (which is later verified when the real decode operation catches up to this starting index). Hence, by discarding the initial incorrect speculative symbols, genuine symbols can be decoded and cached ahead of time using the speculative operation during cycles in which the real operation is waiting for a result while the real operation always generates the correct symbols.

Check-pointing the bit-index and code-type of the first cached speculative symbol and comparing it with the advancing index of the real operation can accurately provide information about the correctness of the first cached speculative symbol. In the event of a match of the indices and code-types, all speculative cached symbols are confirmed to be accurate and are committed, resulting in higher throughput. In the rare event of a mismatch, the cached symbols are flushed and a new speculative operation is launched. The speculative decoding operation may leverage header processing computations done by the real decoding operation and opportunistically use common hardware (e.g., decode data paths comprising content addressable memory (CAM) tables, SRAMs, ALU-based Huffman decoders, etc.) thereby resulting in minimal additional logic overhead and impact on the performance of the real decoding operation. In one embodiment, in the event of a collision for using a hardware resource (e.g., a decode path comprising an ALU-based Huffman decoder), the real decode operation gets higher priority than the speculative decode operation. This allows multiple speculative decodes on a DEFLATE payload without slowing down the real decode operation.

Particular embodiments also identify pathogenic payloads and selectively isolate these payloads from speculative decoding. Randomly decoding a compressed stream at an arbitrary location (as may be done with speculative decoding) can result in an attempt to process a non-existent code (e.g., Huffman code). In a memory based decoding implementation, this may lead to a miss or invalid look-up, whereas in an ALU based decoder, this may lead to a non-terminating loop of repetitive trials of all possible code-lengths. Software based implementations that use one of these underlying schemes can thus result in deadlock. Although such events are rare, identifying and mitigating such scenarios result in logic overhead and throughput loss for thread recovery. In various embodiments of the present disclosure, such pathogenic payloads are identified and speculative decoding is not performed on such payloads, thus guaranteeing that the aforementioned deadlock events never occur. Such embodiments may simplify implementation as well as verification of the decompression engine.

FIG. 10 illustrates an exemplary processor 1000 on which embodiments of the present disclosure may be implemented. A decompression engine 1004 is included within processor 1000 for performing the real and speculative decode operations described herein. In the embodiment of FIG. 10, a single decompression engine 1004 is shared by all of the cores 1002. In an alternate embodiment, each core includes its own instance of a decompression engine 1004 (or multiple instances). In yet another embodiment, the decompression engine 1004 may be implemented on a semiconductor chip separate from the semiconductor chip of the processor 1000 and may be communicatively coupled to the processor over a communication link/bus. The underlying principles of the present disclosure are not limited to any particular architectural arrangement for integrating the decompression engine 1004 into a computer system.

Table update logic 1006 analyzes a payload header of a data block and populates code tables 1008, 1009, 1010, 1011, 1012, and 1013 based on information specified in the header. In various embodiment, the payload header may specify a plurality of code lengths that may be used to determine the codes used for the literal, length, and distance symbols. These code lengths themselves may be Huffman encoded. The code lengths are stored in entries in the code length table and the codes for the code lengths are used as addresses into the code length table.

In one embodiment, symbol values corresponding to the literal and length codes for a data block are placed together in literal and length table 1010 and in literal and length translation table 1011, while symbol values corresponding to the distance codes for the data block are stored in distance table 1012 and distance translation table 1013. The tables may be implemented using any suitable type of memory. Non-limiting examples of memory that could be used to store the tables include SRAM and CAM.

Every new block's header is processed to generate Huffman codes unique to the block's symbols and the corresponding symbol values are populated into the tables at indices corresponding to the codes. For example, a header of a new block is processed after the EOB symbol of the current block is reached and all tables are repopulated before decoding the new block of compressed data. After the code tables are populated, literals and/or length+distance pairs from the payload are decoded and the original bit-stream is recreated by decompression engine 1004.

In one embodiment, the decompression engine 1004 comprises a real decoder 1014 and a speculative decoder 1016 which work together with table update logic 1006 to implement the techniques described herein. Thus, one embodiment may feature two Huffman decode data-paths that operate on the same DEFLATE block and access the same code tables (e.g., tables 1008, 1010, and 1012). The real decoder 1014 initiates population of the code tables and advances sequentially from the very first code of the payload. A computing operation that serially advances from the start of the data block is called a real decode operation (or non-speculative decode operation) herein. A real decode operation generates one symbol per decode cycle with 100% accuracy. Symbols generated from the real decoder 1014 are consumed by a buffer to create the decompressed stream.

In one embodiment, speculative decoder 1016 initiates decode at a point that is offset from the start of the payload. Such a point may be random or predetermined. The point may be a mid-point or other point in the payload. A computing operation that advances from a location other than the start of the data block is called a speculative decode operation. The speculative decode operation uses the existing code tables 1008, 1010, and 1012 populated by the real decode operation and proceeds with Huffman decoding based on the code tables without updating the entries of the code tables. Because the speculative decode starts from a random bit-index (which could possibly be part of a different block) it might miss or find an invalid entry in one of the code tables (or otherwise determine that no valid code is found) after advancing with a few matches or may never miss or find an invalid entry and may advance until the end of the block. In the case of a miss or an invalid entry (or other determination that no valid code is found), all symbols decoded by the speculative decoder up to that point can be marked off as incorrect.

The number of decode cycles following which a speculative decoder starts generating accurate symbols is termed as its convergence window. Most speculative decode operations converge relatively early (e.g., convergence windows for particular compressed data may vary from 0 to 41 cycles). Hence, if a few initial symbols (higher than the convergence window) are discarded, the speculative decode operation can continue to advance and generate 100% accurate symbols, thereby enabling concurrent out-of-order decompression (in which the speculative decoder utilizes clock cycles not utilized by the real decoder).

In a particular embodiment, the index and the symbol type (literal or length+distance) for the first decoded symbol after the convergence window are checkpointed in an index-matching buffer. All subsequent speculative symbols are stored in a temporary buffer. In one embodiment, the index-matching buffer indicates a mismatch when the progressing index of the real decoder 1014 exceeds the check-pointed index of speculative decoder 1016. If the index-matching buffer indicates a mismatch, then a flush unit causes speculative symbols to be cleared and a re-speculate signal may be provided to the speculative decoder 1016 to reattempt speculation (e.g., at a different point within the payload). Most of the time, the index (within the payload) of the real decoder 1014 advances and subsequently overlaps (i.e., equals) the speculative decoder's check-pointed bit index. At this stage, the real decoder 1014 validates the speculative decoder's results by comparing its decoded symbol type at the index matching the check pointed index with the symbol type decoded by the speculative decoder at the check-pointed index. In one embodiment, in case of a match, all speculative symbols in a temporary buffer commit and are consumed to update the decompressed stream buffer (i.e., combining the speculative and real results). In some embodiments, when the index of the real decoder matches the checkpointed index, the real decoder and the speculative decoder may swap roles, such that logic that previously performed the real decode operation now performs a speculative decode operation and vice versa.

In one embodiment, in the event where the speculative decoder encounters an EOB code, it stalls until the real decoder validates the symbols produced by the speculative decoder (e.g., up to the check-pointed index). In a similar event, when the real decoder encounters an EOB code and stalls, the speculative decode operation is flushed by invalidating its check-pointed index and contents in the temporary buffer. When an EOB code is encountered, the header for the next block is processed, the code tables are updated, and a new pair of real and speculative decode operations are launched. When the index of the real decode operation goes past the check-pointed index without an overlap, the speculative symbols are flushed.

Although in embodiments discussed herein a speculative decode is check-pointed only once, other embodiments contemplate storing the speculative decode operation's indices at multiple checkpoints. For such embodiments, a mismatch at the first checkpoint will only invalidate symbols decoded between the first and second checkpoints while allowing the speculative decode operation to progress. Similarly, a mismatch at the second checkpoint will invalidate symbols decoded between the second and third checkpoints, and so on.

During Huffman decoding, each decoder 1014 and 1016 compares a portion of the payload against entries in the code tables. A successful decode cycle results in generation of the code-length and the corresponding symbol for the matching Huffman code. The code-length is used to advance the encoded stream to fetch the next payload. For example, the sum of the code length and (if applicable) the extra number of bits that get picked from the payload is the actual number of bits that gets consumed in any particular decode cycle. The payload is shifted (i.e., the index of the decoder advances) by the number of bits consumed to generate the next set of bits (e.g., 15 bits) to be used for decoding.

In various embodiments, each decoder 1014 and 1016 shares one or more decode paths, where a decode path comprises logic to identify a symbol (or at least an indication of a symbol) matching a code included in the payload portion being analyzed by the decode path. The decoders may share a decode path by providing inputs to and receiving outputs from the decode path on different cycles. In the embodiment depicted, real decoder 1014 and speculative decoder 1016 share a fast decode path 1018 and a slow decode path 1020.

A fast decode path 1018 may provide a result with a relatively low latency (e.g., two clock cycles, three clock cycles, four clock cycles, etc.). As one example, in a fast decode path with a two cycle latency, an input is presented to the fast decode path 1018 during a first clock cycle and the corresponding output (e.g., symbol) is provided in the next clock cycle. Because a decoder has to wait for an output before it is able to provide the next input, the decoder obtains a result from the fast decode path every two clock cycles, and thus the fast decode path has a two cycle latency. As another example, if a fast decode path had a three cycle latency, it would accept an input from a decoder in a first clock cycle and would provide the output to the decoder in the third clock cycle.

In various embodiments, the fast decode path may comprise one or more look up tables implemented in any suitable memory, such as SRAM or CAM. In the embodiment depicted, the fast decode path 1018 includes literal/length table 1010 and distance table 1012.

In a particular embodiment, fast decode path 1018 comprises at least one lookup table (e.g., literal/length table 1010 and/or distance table 1012) that includes entries addressed by codes. For example, an address that includes (e.g., begins with) a code may be used as an index into the table and a symbol value corresponding to the code may be obtained from the corresponding entry of the table. In various embodiments, an entry of the lookup table also includes a valid identifier specifying whether the entry stored in the entry of the lookup table is valid and a length identifier specifying how long the code was (since the address used to index the lookup table may include subsequent bits that are not a part of the current code if the address ends up being longer than the identified code). The symbol values may be expressed in any suitable manner. In a particular embodiment, a symbol value of a literal may be a value from 0 to 255 corresponding to a literal byte, a symbol value of a length includes bits specifying at least a portion of the length (e.g., the most significant bits) and (at least in some cases) bits specifying how many additional bits from the payload should be appended to the bits specifying the portion of the length, and a symbol value of a distance includes bits specifying at least a portion of the distance (e.g., the most significant bits) and (at least in some cases) bits specifying how many additional bits from the payload should be appended to the bits specifying the portion of the distance.

In various embodiments, the fast decode path 1018 only includes entries for a portion of the code space. For example, the fast decode path 1018 may be able to decode codes that are up to a particular bit length (e.g., 9 bits). In various embodiments, this bit length is equal to the bit length of the address that is used to index the fast decode path. Thus, the lookup table of the fast decode path 1018 may include entries for all 1 bit codes, 2 bit codes, 3 bit codes, 4 bit codes, 5 bit codes, 6 bit codes, 7 bit codes, 8 bit codes, and 9 bit codes (though each code length is not necessarily used in each block). In this example, the lookup table may have $2^9=512$ entries. In various situations, a vast majority (e.g., >95%) of the codes are less than or equal to 9 bits and thus will be resolved using the fast decode path 1018.

In some embodiments, multiple entries of a lookup table (e.g., literal/length table 1010 or distance table 1012) of the fast decode path may be populated with the same values. For example, if a lookup table is indexed by a 9-bit address and contains a symbol value for an 8-bit code, two entries of the lookup table may store the symbol value (since both 9-bit addresses that begin with the 8-bit code should return the same symbol value whether the last bit is a 1 or a 0). Each 7-bit code may index to 4 entries storing the symbol value corresponding to the code, each 6-bit code may index to 8 entries storing the symbol value corresponding to the code, and so on.

If a code is longer than the length of codes resolved by the fast decode path 1018, the code may be resolved by a slow decode path 1020. As one example, if the fast decode path 1018 resolves codes up to 9 bits long, the slow decode path may resolve codes that are between 10 and 15 bits long. In various embodiments, the slow decode path 1020 may progress through possible codes by ascending code length. For example, the slow decode path 1020 may determine whether the first 10 bits of an input (e.g., 15 bits from the payload) corresponds to a valid code. If it does not, the slow decode path 1020 may determine whether the first 11 bits of an input corresponds to a valid code, and so on. The slow path may determine whether an input value corresponds to a valid code in any suitable manner. For example, in one embodiment, when the header of the data block is analyzed, the slow decode path 1020 may be provided with information indicating the starting value of each code for each code length and how many codes are used for each code length. Based on this information, for a particular input length, the slow decode path 1020 may determine whether the input value falls within the range of codes of that length. If it does not, then the slow decode path 1020 may append an additional bit to the input and make a similar determination as to whether the input falls within the range of codes of the new code length, and so on. If the slow decode path 1020 determines that the code is valid, it may generate an index into the appropriate table (e.g., literal/length translation table 1011 or distance translation table 1013) and the corresponding symbol value is retrieved.

In a particular embodiment, when the header of a data block is parsed, the literal/length translation table 1011 and the distance translation table 1013 of the slow decode path 1020 are populated. In a particular embodiment, the entries of each table are ordered based primarily on ascending code lengths and secondarily on ascending codes of the same code length. For example, all entries corresponding to 10 bit codes are placed (in ascending order) before entries corresponding to 11 bit codes which are placed before entries corresponding to 12 bit codes and so on. In these tables, a code may correspond to a single table entry that stores the symbol value corresponding to that code (and thus these tables may be relatively compact).

The slow decode path generally provides results with a higher latency than the fast decode path (and the latency may be dependent on how long the code is), where the latency for the slow decode path 1020 is defined in a manner similar to the latency of the fast decode path 1018 described above (i.e., the number of clock cycles to produce an output, including the clock cycle in which the input was presented to the decode path). As one example, the slow decode path may resolve codes with a latency between 3 and 12 cycles, depending on the length of the code. In various embodiments, slow decode path 1020 is ALU-based. For example, slow decode path 1020 may comprise an auxiliary lightweight ALU operable to determine symbols corresponding to input codes.

Figure 11:
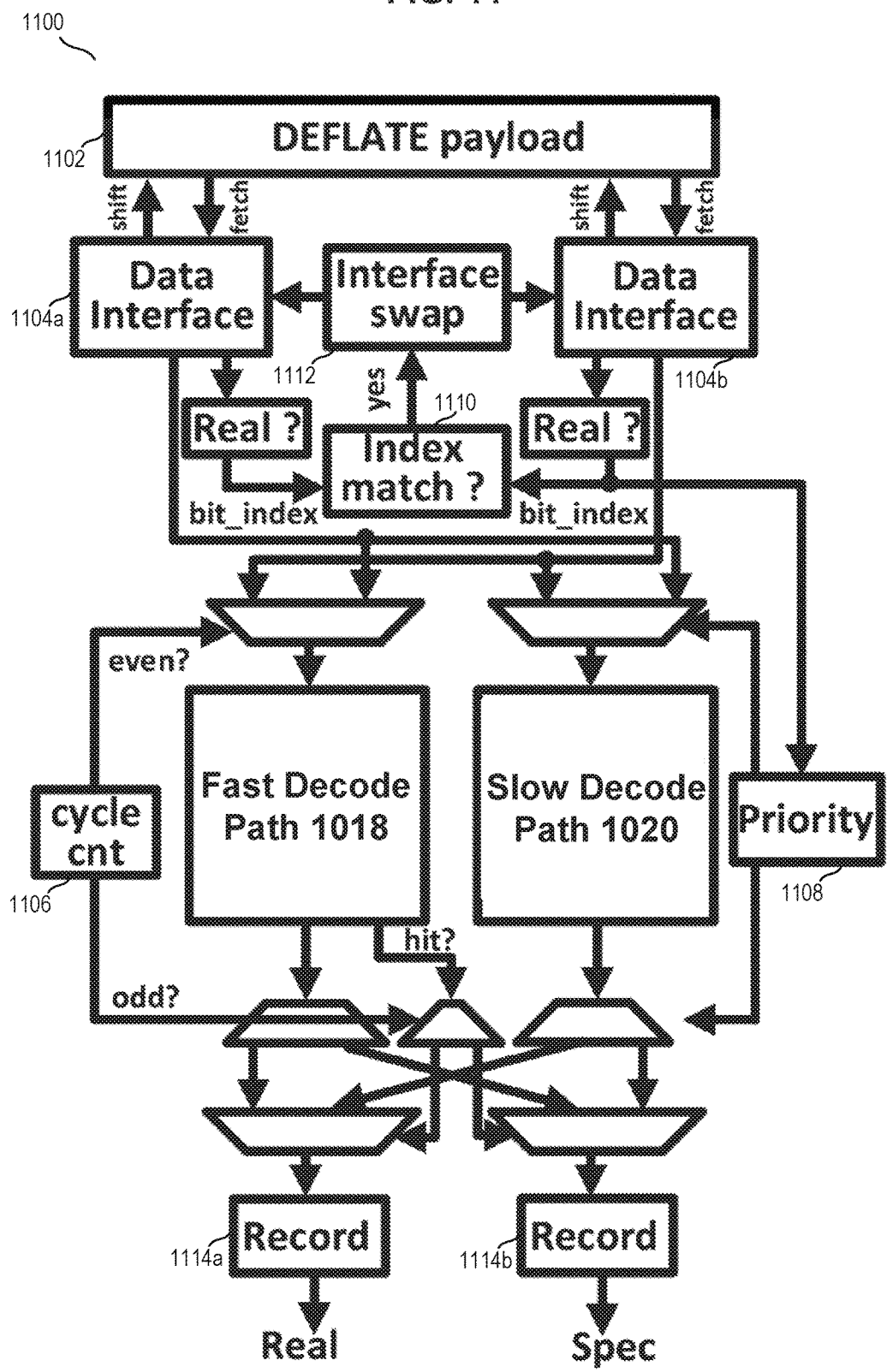
FIG. 11 illustrates an example data path of an example decompression engine in accordance with certain embodiments.

FIG. 11 illustrates an example data path 1100 of an example decompression engine in accordance with certain embodiments. For example, the data path 1100 may be the data path of decompression engine 1004 or other decompression engine described herein.

DEFLATE payload 1102 comprises a plurality of Huffman codes in a compressed data block. Each decoder (the real decoder and the speculative decoder) each utilize a respective data interface 1104 to fetch a portion (e.g., 15 bits) of the payload during a decode cycle. The portion fetched by a decoder may be shifted each decode cycle by the length of the code decoded in the previous decode cycle of the decoder. A data interface 1104 utilized by a speculative decoder may also include logic to calculate an offset into the DEFLATE payload at which a speculative decode operation is to begin. In various embodiments, a flag may be associated with each data interface 1104, indicating whether the interface is associated with the real decoder or the speculative decoder.

Cycle count logic 1106 tracks whether the clock cycle is even or odd (of course if multiple speculative decoders were used at the same time at different points of the data block the cycle count logic 1106 could track the clock cycle that is associated with each decoder). The cycle count logic 1106 may control whether an input to the fast decode path 1018 is provided by the real decoder or the speculative decoder. The cycle count logic 1106 may also control which buffer a decoded symbol is passed into based on whether the clock cycle is even or odd. As one example, if a clock cycle is even, the symbol decoded is placed into a buffer associated with the real decoder, and if a clock cycle is odd, the symbol decoded is placed into a buffer associated with the speculative decoder.

Priority logic 1108 controls access to the slow decode path 1020. In various embodiments, priority logic 1108 grants access to the slow decode path 1020 to the real decoder if there is a conflict between the real decoder and the speculative decoder. This ensures that the real decode operation proceeds without interruption such that its throughput is not adversely impacted by the speculative decode operation. For example, during a clock cycle in which the slow decode path 1020 is performing operations on behalf of the speculative decoder, it may be determined that the fast decode path is unable to resolve a symbol for a payload portion of the real decoder. In the next clock cycle, the priority logic 1108 gives access to the slow decode path 1020 to the real decoder instead of the speculative decoder. In various embodiments, the state of the particular decoding operation being performed by the slow decode path 1020 may be saved prior to access being given to the real decoder. Once the real decoder is finished using the slow decode path 1020, access to the slow decode path 1020 is again granted to the speculative decoder and the decoding operation resumes from the saved state (or could be started over in a different embodiment).

Index match logic 1110 may determine whether the index of the real decoder has caught up with a checkpoint index (e.g., as described above). If the index of the real decoder matches the checkpoint index, index match logic 1110 may send a signal to interface swap logic 1112 to swap the interfaces (such that the interface previously used for the real decoder is now used by the speculative decoder, and vice versa). Thus, the real decode operation may transition to a speculative decode operation and may jump forward into the payload 1102 by a newly calculated offset. If the index of the real decoder does not match the checkpoint index, then symbols decoded by the speculative decoder may be flushed and the speculative decoder may launch a new speculative decoding operation at a newly calculated offset. The interface swap logic 1112 may also update the flags that indicate which interface is associated with the real decode operation.

Swapping the interfaces 1104 where the critical path is determined by simpler logic reduces speculation area overhead compared to an alternative approach where downstream Huffman decode and record generation blocks with complicated circuits are swapped. An interface swap event may also be communicated downstream to the record generation units 1114 to generate a flag to indicate that all speculative symbols generated prior to the swap event should be committed. Thus, if an extra symbol is generated by the speculative thread after the convergence has occurred, this extra symbol may be flushed out thereby preserving the integrity of the data.

Record generation blocks 1114a and 1114b may generate records based on the output of the fast decode path 1018 and/or slow decode path 1020. In various embodiments, the records are in a format easily consumable by a processor (e.g., using corresponding load and store instructions). In one embodiment, a record may specify either a sequence of literals or a length/distance pair, although literals and/or length distance pairs could be included in a single record in other embodiments. In a particular embodiment, a record specifies a buffer in which the literal sequence and/or length/distance pair is stored and a size (e.g., number of bytes) of the literal sequence and/or length/distance pair.

Figure 12:
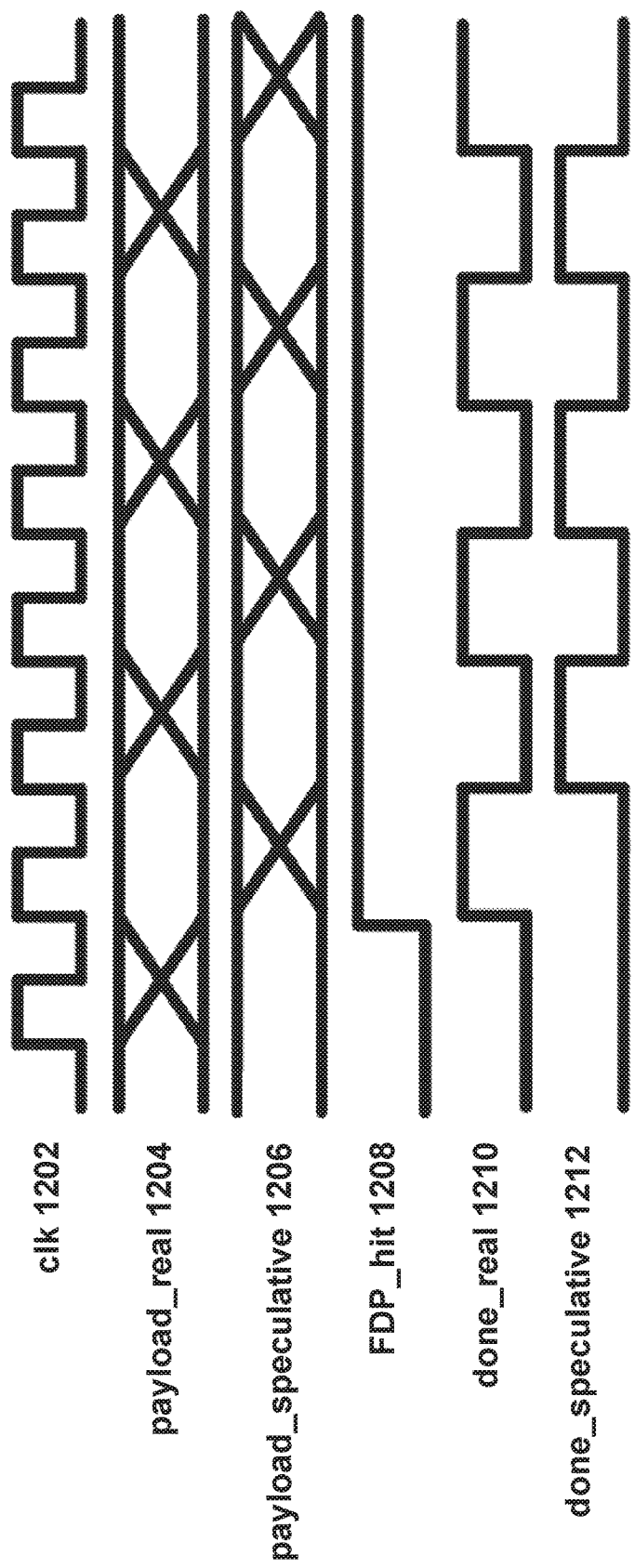
FIG. 12 is an example timing diagram associated with an example decompression engine in accordance with certain embodiments.

FIG. 12 is an example timing diagram 1200 associated with a decompression engine in accordance with certain embodiments. Diagram 1200 depicts a clock signal 1202, which may be a clock signal that is provided to one or more data paths of a decompression engine and used to clock logic of the one or more data paths. For example, the clock may be provided to fast decode path 1018 and used to clock memory circuits of the fast decode path 1018. As another example, the clock may be provided to slow decode path 1020 and used to clock memory circuits and/or control logic of the slow decode path 1020.

Diagram 1200 also depicts a payload_real signal 1204 which depicts the timing of provision of data from the payload to the fast decode path 1018 by the real decoder. Similarly, payload_speculative signal 1206 depicts the timing of provision of data from the payload to the fast decode path 1018 by the speculative decoder. Thus, at the start of the first clock cycle, data from the payload is provided to the fast decode path 1018 by the real decoder. At the start of the second clock cycle, data from the payload is provided to the fast decode path 1018 by the speculative decoder. At the start of the third cycle, the next data sequence from the real decode operation is provided to the fast decode path 1018 by the real decoder. At the start of the fourth clock cycle, the next data sequence from the speculative decoder operation is provided to the fast decode path 1018 by the speculative decoder. The input to the fast decode path 1018 may alternate each clock cycle for any suitable number of clock cycles. Of course, various events (e.g., a miss in the fast decode path 1018 and subsequent usage of the slow decode path 1020 or an interface swap event could interrupt this pattern for a short period of time). In an embodiment involving multiple speculative decoders, the input to the fast decode path 1018 may change each clock cycle (e.g., if three speculative decoders are used, the real decoder and each speculative decoder may provide an input once every four clock cycles).

FDP_hit signal 1208 depicts an example signal depicting whether a hit in the fast decode path occurred (i.e., whether a matching code was found by the fast decode path). Because in various embodiments, fast decode path 1018 is unable to provide an output in the same clock cycle as the input, signal 1208 does not go high until one clock cycle after the real decoder provided the first input to the fast data path at the beginning of the first clock cycle. The transition of signal 1208 occurs in response to the same clock edge as the done_real signal 1210 which indicates that the fast data path has a result for the real decoder. FDP_hit signal 1208 stays high in the third clock cycle as the done_speculative signal 1212 transitions (the transition indicating that the fast data path has a result for the speculative decoder). Thus, results may be provided to the real decoder and the speculative decoder in alternating clock cycles. Accordingly, idle cycles that would be present if only the real decoder utilized the fast decode path are utilized to provide results to the speculative decoder. Thus, the speculative decoder utilizes bandwidth of the fast decode path (and the slow decode path) that is unused by the real decoder.

Figure 13:
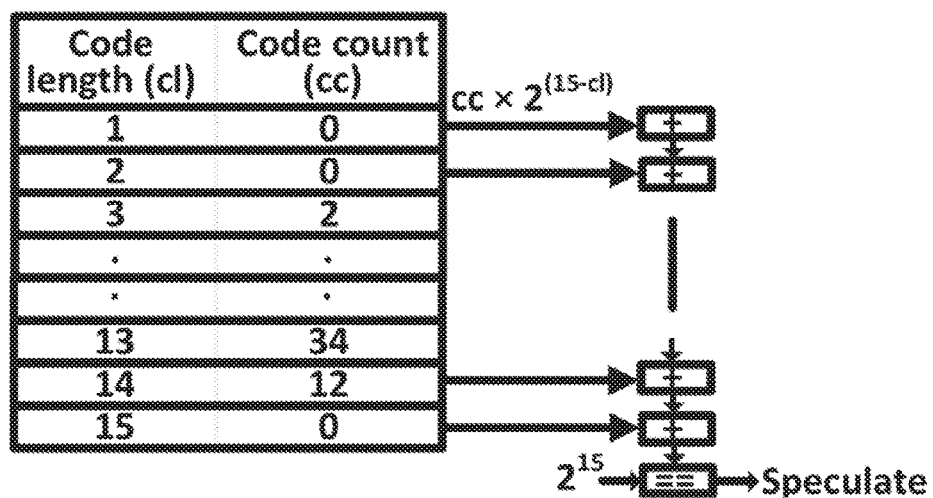
FIG. 13 is an example code-count distribution table in accordance with certain embodiments.

FIG. 13 is an example code-count distribution table 1300 in accordance with certain embodiments. A speculative decode operation starting at a random offset of an arbitrary payload can theoretically cause the decompression engine to enter a never ending loop trying to decode a non-existent code. However, the distribution of Huffman codes specified in the payload header provides enough information to quantify the probability of encountering such codes. Table 1300 depicts an example of the number of occurrences of various code-lengths for a DEFLATE compressed payload. The code-length range of 1 bit to 15 bits defines a total encoding space of $2^{15}$=32,768 possible codes. A maximum of $2^{15}$ Huffman codes are possible in an extreme case where all codes are 15 bits long. Smaller codes exhaust more encoding space than longer codes, and the encoding space exhausted per code increases quadratically for every 1 bit reduction in code-length. Hence, a weighted sum of the code-counts for all code-lengths provides a measure of total used encoding space. In various systems, a portion of a payload picked at random that lands in the unused encoding space can't be decoded and could lead to deadlock. If the weighted sum of the code-counts equals $2^{15}$, the unused encoding space is null, thus guaranteeing no missing Huffman code will ever be encountered and deadlock may be avoided. In various embodiments, if the unused encoding space for a data block is not null (i.e., at least one code is unused), then a speculative decode operation is not launched for that particular data block to avoid the possibility of deadlock. In sum, the magnitude of unused code space can be computed from the block header to adaptively use speculation for compressed streams that can be guaranteed to never encounter deadlock resulting from an attempt to decode a non-existing Huffman code. Such embodiments may allow the omission of logic dedicated to recovering from deadlock situations in the speculative decode operation.

As depicted in FIG. 13, a code-count may be generated for each code length. A weighted sum component may be determined for each code length based on the code-count. In general, the weighted sum component is calculated as $CC \times 2^{max\_cl-cl}$, where CC is the code count, max_cl is the maximum code length (in this case 15), and cl is the specific code length corresponding to the code-count. Accordingly, in the embodiment depicted, each code count is multiplied by $2^{15-cl}$ to determine the corresponding weighted sum component. In the embodiment depicted, code lengths of 1, 2, and 15 are associated with weighted sum components of 0, code length 3 is associated with a weighted sum component of $2 \times 2^{12} = 8192$, code length 13 is associated with a weighted sum component of $34 \times 2^2 = 136$, code length 14 is associated with a weighted sum component of $12 \times 2^1 = 24$, and the code lengths for code lengths 4-12 are not shown. If the sum of the weighted sum components equals $2^{max\_cl}$ (in this case $2^{15}$), then a speculative decode operation may be launched on the data block, but otherwise is not performed. The various operations depicted in FIG. 13 may be performed by any suitable logic (such as any of the logic described herein).

Figure 14:
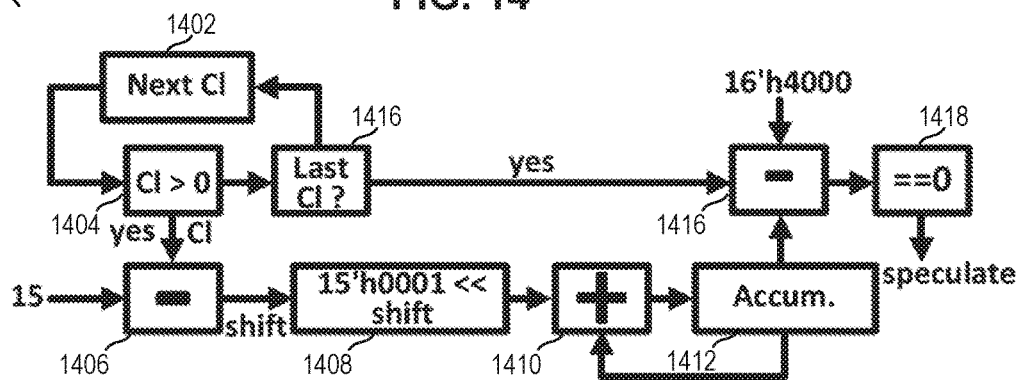
FIG. 14 is an example data path for enabling speculative decompression in accordance with certain embodiments.

FIG. 14 is an example data path 1400 for enabling speculative decompression in accordance with certain embodiments. Data path 1400 depicts low overhead logic that progressively accumulates the encoding space exhausted as each code-length is parsed from the payload header. The accumulated sum is subtracted from a value representing the total encoding space and compared against 0 to generate a flag that enables the speculative decoder in the decompression engine. In various embodiments, this logic operates concurrently with payload header parsing logic (e.g., table update logic 1006) without impacting system throughput, and incurs very low area overhead (e.g., <1% of the decompression engine 1004).

FIG. 14 depicts an example in which the maximum code length is fifteen, but may be adapted for any other suitable code length. Logic block 1402 obtains the next code length from the header. Block 1404 determines whether the code length is greater than zero. If the code length is greater than zero, the code length is subtracted from 15 by block 1406. The code length is then bit shifted by block 1408 by the result of block 1406 (thus effectively multiplying the code length by $2^{15-cl}$. The result of block 1408 is added by block 1410 to a running sum stored in block 1412 (which is reset to zero before the first code length is processed). These operations continue for each code length. When the last code length is processed, the running sum in block 1412 is subtracted from 2^15 at block 1416 and compared against 0 at block 1418. If the sum is equal to 0, then a speculate signal is activated. Otherwise, the speculate signal is not activated.

Figure 15:
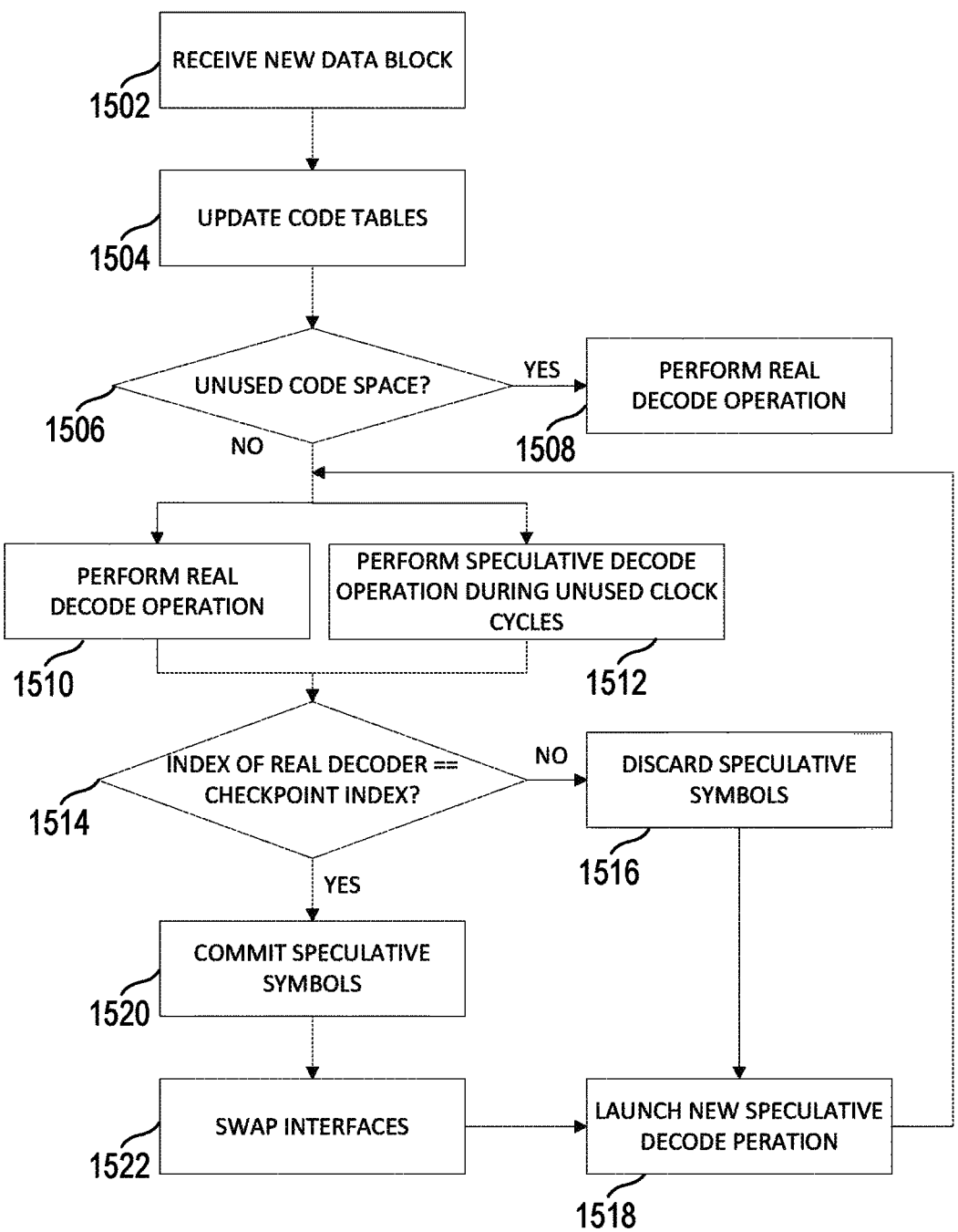
FIG. 15 is an example flow for performing time-multiplexed real and speculative decompression in accordance with certain embodiments.

FIG. 15 is an example flow for performing time-multiplexed real and speculative decompression in accordance with certain embodiments. The operations, along with any other operations described herein relating to decompression of a data set, may be performed by any suitable logic, such as decompression engine 1004 or other suitable logic.

At 1502, a new data block is received (e.g., into a buffer of the decompression engine 1004). At 1504, code tables are updated. For example, the code tables may include information from a header that describes how to decode a payload of the data block. In one embodiment a code length table, a literal/length table, a literal/length translation table, a distance table, and a distance translation table are updated.

At 1506, a determination is made as to whether an entire code space is used. In various embodiments, this operation is performed in parallel with operation 1504. This operation may utilize information from the header (e.g., code lengths specified in the header) of the data block. If the entire code space is not used, then a speculative decode operation is not launched and a real decode operation may be performed at 1508 until an EOB code is encountered, at which point the flow may return to 1502. If the entire code space is used, a speculative decode operation may be performed at 1512 during unused clock cycles of one or more decode paths shared by the speculative decode operation and a real decode operation performed at 1510.

At 1514, when the index of the real decode operation has caught up with a checkpoint index of the speculative decode operation, a determination is made as to whether the index of the real decoder is equal to the checkpoint index. If the index is equal and the symbol decoded at that index by the real decoder is equal to the symbol decoded at that index by the speculative decoder, then the speculative symbols are committed at 1520 and the interfaces used by the real decoder and the speculative decoder are swapped at 1522. If the indices are not equal or the symbols don't match, the speculative symbols are discarded at 1516. At 1518 a new speculative decode operation is launched and the flow returns to 1510 and 1512.

The flow described in FIG. 15 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 15 may be repeated, combined, modified or omitted where appropriate. Additionally, operations may be performed in any suitable order without departing from the scope of particular embodiments.

The generic nature of the techniques described herein makes them agnostic to any underlying hardware that the computing platform uses for Huffman decode (e.g., CAM, SRAM, or ALU). Hence, this approach can be seamlessly leveraged in any existing system (that performs DEFLATE decompression) using software to exploit the full potential of its hardware to accelerate DEFLATE.

The look-ahead speculation with index check-pointing technique described herein improves raw decompression throughput over similar designs with no speculation. Although this embodiment includes a decode flow for a system with one active speculation decode operation, the underlying principles of the present disclosure may implement convergence window, index check-pointing, and role-swapping on a system with multiple active decode speculations.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 530 illustrated in FIG. 5, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the functionality of the various components such as decompression engine 1004, table update logic 1006, real decoder 1016, fast decode path 1018, slow decode path 1020 (and the various logical components therein), or other component or system described herein. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a decompression engine to perform a non-speculative decode operation on a first portion of a first compressed payload comprising a first plurality of codes; and perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

In an embodiment, the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle. In an embodiment, the fast decode path is to provide an output for the speculative decode operation in the first clock cycle and an output for the non-speculative decode operation in the second clock cycle. In an embodiment, the fast decode path comprises a lookup table implemented in static random access memory (SRAM). In an embodiment, the fast decode path comprises a lookup table implemented in content addressable memory (CAM). In an embodiment, the at least one decode path further comprises a slow decode path with a longer latency than the fast decode path. In an embodiment, the slow decode path comprises an arithmetic logic unit (ALU)-based decoder. In an embodiment, the slow decode path is to provide lookup of codes having lengths greater than codes that are to be lookup up by the fast decode path. In an embodiment, priority to access the slow decode path is to be given to the non-speculative decode operation in the case of a conflict between the non-speculative decode operation and the speculative decode operation. In an embodiment, the decompression engine is further to determine not to launch a speculative decode operation on a second compressed payload in response to a determination that a code space associated with the second compressed payload is not fully utilized. In an embodiment, determining that the code space associated with the second compressed payload is not fully utilized comprises calculating a weighted sum using the number of codes used for a plurality of different code lengths. In an embodiment, the decompression engine is further to perform a second speculative decode operation on a third portion of the first compressed payload, wherein performing the second speculative decode operation includes utilizing bandwidth of the at least one decode path that is not used by the non-speculative decode operation or the speculative decode operation and wherein the speculative decode operation and the second speculative decode operation are active at the same time. In an embodiment, the speculative decode operation is to be launched at a starting point of the first compressed payload that is different from a starting point of the non-speculative decode operation. In an embodiment, the first plurality of codes comprise Huffman codes.

In at least one embodiment, a method comprises performing a non-speculative decode operation on a first portion of a first compressed payload comprising a first plurality of codes; and performing a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

In an embodiment, the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle. In an embodiment, the fast decode path is to provide an output for the speculative decode operation in the first clock cycle and an output for the non-speculative decode operation in the second clock cycle. In an embodiment, the fast decode path comprises a lookup table implemented in static random access memory (SRAM). In an embodiment, the fast decode path comprises a lookup table implemented in content addressable memory (CAM). In an embodiment, the at least one decode path further comprises a slow decode path with a longer latency than the fast decode path. In an embodiment, the slow decode path comprises an arithmetic logic unit (ALU)-based decoder. In an embodiment, the slow decode path is to provide lookup of codes having lengths greater than codes that are to be lookup up by the fast decode path. In an embodiment, priority to access the slow decode path is to be given to the non-speculative decode operation in the case of a conflict between the non-speculative decode operation and the speculative decode operation. In an embodiment, the method further comprises determining not to launch a speculative decode operation on a second compressed payload in response to a determination that a code space associated with the second compressed payload is not fully utilized. In an embodiment, determining that the code space associated with the second compressed payload is not fully utilized comprises calculating a weighted sum using the number of codes used for a plurality of different code lengths. In an embodiment, the method further comprises performing a second speculative decode operation on a third portion of the first compressed payload, wherein performing the second speculative decode operation includes utilizing bandwidth of the at least one decode path that is not used by the non-speculative decode operation or the speculative decode operation and wherein the speculative decode operation and the second speculative decode operation are active at the same time. In an embodiment, a system comprises means to perform the methods described above. In an embodiment, the means comprise machine-readable code that when executed, cause a machine to perform one or more steps of the methods described above.

In an embodiment, a system comprises a processor to access data decoded from a compressed payload comprising a first plurality of codes; and a decompression engine to perform a non-speculative decode operation on a first portion of the first compressed payload; and perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

In an embodiment, the system further comprises a battery communicatively coupled to the processor, a display communicatively coupled to the processor, or a network interface communicatively coupled to the processor.

In at least one embodiment, at least one machine readable storage medium has instructions stored thereon, the instructions when executed by a machine to cause the machine to perform a non-speculative decode operation on a first portion of a first compressed payload comprising a first plurality of codes; and perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

In an embodiment, the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle. In an embodiment, the instructions when executed further cause the machine to determine not to launch a speculative decode operation on a second compressed payload in response to a determination that a code space associated with the second compressed payload is not fully utilized. In an embodiment, determining that the code space associated with the second compressed payload is not fully utilized comprises calculating a weighted sum using the number of codes used for a plurality of different code lengths. In an embodiment, the speculative decode operation is to be launched at a starting point of the first compressed payload that is different from a starting point of the non-speculative decode operation.

In at least one embodiment, a system comprises means for performing a non-speculative decode operation on a first portion of a first compressed payload comprising a first plurality of codes; and means for performing a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

In an embodiment, the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle. In an embodiment, the system further comprises means for determining not to launch a speculative decode operation on a second compressed payload in response to a determination that a code space associated with the second compressed payload is not fully utilized. In an embodiment, determining that the code space associated with the second compressed payload is not fully utilized comprises calculating a weighted sum using the number of codes used for a plurality of different code lengths. In an embodiment, the speculative decode operation is to be launched at a starting point of the first compressed payload that is different from a starting point of the non-speculative decode operation.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a decompression engine to:
perform a non-speculative decode operation on a first portion of a first compressed payload comprising a first plurality of codes; and
perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

2. The apparatus of claim 1, wherein the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle.

3. The apparatus of claim 2, wherein the fast decode path is to provide an output for the speculative decode operation in the first clock cycle and an output for the non-speculative decode operation in the second clock cycle.

4. The apparatus of claim 2, wherein the fast decode path comprises a lookup table implemented in static random access memory (SRAM).

5. The apparatus of claim 2, wherein the fast decode path comprises a lookup table implemented in content addressable memory (CAM).

6. The apparatus of claim 2, wherein the at least one decode path further comprises a slow decode path with a longer latency than the fast decode path.

7. The apparatus of claim 6, wherein the slow decode path comprises an arithmetic logic unit (ALU)-based decoder.

8. The apparatus of claim 6, wherein the slow decode path is to provide lookup of codes having lengths greater than codes that are to be lookup up by the fast decode path.

9. The apparatus of claim 6, wherein priority to access the slow decode path is to be given to the non-speculative decode operation in the case of a conflict between the non-speculative decode operation and the speculative decode operation.

10. The apparatus of claim 1, wherein the decompression engine is further to determine not to launch a speculative decode operation on a second compressed payload in response to a determination that a code space associated with the second compressed payload is not fully utilized.

11. The apparatus of claim 10, wherein determining that the code space associated with the second compressed payload is not fully utilized comprises calculating a weighted sum using the number of codes used for a plurality of different code lengths.

12. The apparatus of claim 1, wherein the decompression engine is further to perform a second speculative decode operation on a third portion of the first compressed payload, wherein performing the second speculative decode operation includes utilizing bandwidth of the at least one decode path that is not used by the non-speculative decode operation or the speculative decode operation and wherein the speculative decode operation and the second speculative decode operation are active at the same time.

13. The apparatus of claim 1, wherein the speculative decode operation is to be launched at a starting point of the first compressed payload that is different from a starting point of the non-speculative decode operation.

14. The apparatus of claim 1, wherein the first plurality of codes comprise Huffman codes.

15. A method comprising:
performing a non-speculative decode operation on a first portion of a first compressed payload comprising a first plurality of codes; and
performing a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

16. The method of claim 15, wherein the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle.

17. The method of claim 15, further comprising determining not to launch a speculative decode operation on a second compressed payload in response to a determination that a code space associated with the second compressed payload is not fully utilized.

18. The method of claim 17, wherein determining that the code space associated with the second compressed payload is not fully utilized comprises calculating a weighted sum using the number of codes used for a plurality of different code lengths.

19. A system comprising:
a processor to access data decoded from a compressed payload comprising a first plurality of codes; and
a decompression engine to:
perform a non-speculative decode operation on a first portion of the first compressed payload; and
perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

20. The system of claim 19, further comprising a battery communicatively coupled to the processor, a display communicatively coupled to the processor, or a network interface communicatively coupled to the processor.

21. At least one non-transitory machine readable storage medium having instructions stored thereon, the instructions when executed by a machine to cause the machine to:

perform a non-speculative decode operation on a first portion of a first compressed payload comprising a first plurality of codes; and perform a speculative decode operation on a second portion of the first compressed payload, wherein the non-speculative decode operation and the speculative decode operation share at least one decode path and the speculative decode operation is to utilize bandwidth of the at least one decode path that is not used by the non-speculative decode operation.

22. The at least one medium of claim 21, wherein the at least one decode path comprises a fast decode path that is to accept an input from the non-speculative decode operation in a first clock cycle and accept an input from the speculative decode operation in a second clock cycle, wherein the second clock cycle is the next clock cycle after the first clock cycle.

23. The at least one medium of claim 21, the instructions when executed to further cause the machine to determine not to launch a speculative decode operation on a second compressed payload in response to a determination that a code space associated with the second compressed payload is not fully utilized.

24. The at least one medium of claim 23, wherein determining that the code space associated with the second compressed payload is not fully utilized comprises calculating a weighted sum using the number of codes used for a plurality of different code lengths.

25. The at least one medium of claim 21, wherein the speculative decode operation is to be launched at a starting point of the first compressed payload that is different from a starting point of the non-speculative decode operation.

* * * * *